United States Patent [19]
Yang

[11] Patent Number: 5,896,327
[45] Date of Patent: Apr. 20, 1999

[54] MEMORY REDUNDANCY CIRCUIT FOR HIGH DENSITY MEMORY WITH EXTRA ROW AND COLUMN FOR FAILED ADDRESS STORAGE

[75] Inventor: Nien Chao Yang, Hsinchu, Taiwan

[73] Assignee: Macronix International Co., Ltd., Hsinchu, Taiwan

[21] Appl. No.: 08/958,101

[22] Filed: Oct. 27, 1997

[51] Int. Cl.⁶ .................................................. G11C 13/00
[52] U.S. Cl. .................................... 365/200; 365/210
[58] Field of Search ................ 365/189.05, 230.03, 365/200, 210

[56] References Cited

U.S. PATENT DOCUMENTS

| | | | |
|---|---|---|---|
| 3,753,244 | 8/1973 | Sumilas et al. | 340/172.5 |
| 4,047,163 | 9/1977 | Choate et al. | 340/173 R |
| 4,250,570 | 2/1981 | Tsang et al. | 365/200 |
| 4,464,736 | 8/1984 | Smith | 365/200 |
| 4,599,706 | 7/1986 | Gutterman | 365/185.01 |
| 4,649,520 | 3/1987 | Eitan | 365/185 |
| 4,725,980 | 2/1988 | Wakimoto et al. | 365/185 |
| 4,807,003 | 2/1989 | Mohammadi et al. | 357/23.5 |
| 4,970,565 | 11/1990 | Wu et al. | 357/23.5 |
| 4,970,686 | 11/1990 | Naruke et al. | 365/96 |
| 5,089,433 | 2/1992 | Anand et al. | 437/40 |
| 5,208,780 | 5/1993 | Iwase et al. | 365/225.7 |
| 5,257,230 | 10/1993 | Nobori et al. | 365/200 |
| 5,291,046 | 3/1994 | Kumakura | 257/316 |
| 5,386,386 | 1/1995 | Ogihara | 365/200 |
| 5,457,335 | 10/1995 | Kuroda et al. | 257/318 |
| 5,504,706 | 4/1996 | D'Arrigo et al. | 365/185.18 |

FOREIGN PATENT DOCUMENTS

| | | | |
|---|---|---|---|
| 0 686 980 A1 | 12/1995 | European Pat. Off. | G11C 29/00 |
| 0 778 528 A2 | 6/1997 | European Pat. Off. | G06F 11/20 |
| 2-238661 | 9/1990 | Japan . | |
| 4-155959 | 5/1992 | Japan . | |
| 7-230698 | 8/1995 | Japan . | |

OTHER PUBLICATIONS

Cacharelis, P.J. et al., "A Modular 1 μm CMOS Single Polysilicon EPROM PLD Technology", IEEE, Aug. 1988, pp. 60–63.

Ohsaki, K. et al., "A Planar Type EEPROM Cell Structure by Standard CMOS Process and Applications", IBM Japan, Oct. 1994, p. 55.

*Primary Examiner*—Terrell W. Fears
*Attorney, Agent, or Firm*—Mark A. Haynes; Wilson, Sonsini, Goodrich & Rosati

[57] ABSTRACT

A redundancy architecture suitable for high density integrated circuit memory, such as mask ROM is based on a two transistor redundancy cell that has a very small layout. Both row and column failure modes can be repaired. The memory used to characterize the failed row or column is implemented using an extra column or row respectively which is manufactured in a compact layout adjacent the array. Both an extra column and an extra row are laid out adjacent the array, using novel two transistor floating gate cells. Mode select logic is included by which replacement of a row or of a column is selected for the device. In the replacement row mode, a memory cell in the extra column is used to indicate the row to be replaced, and to enable the reading of the data from the replacement word line in place of the failed row. In the replacement column mode, a memory cell in the extra row is used to indicate the column to be replaced, and to enable the sensing of data from the replacement column in place of the failed column in the array.

14 Claims, 11 Drawing Sheets

MEMORY REDUNDANCY CIRCUIT FOR HIGH DENSITY MEMORY WITH EXTRA ROW AND COLUMN FOR FAILED ADDRESS STORAGE

CROSS-REFERENCE TO RELATED APPLICATION

The present application is related to copending application entitled MEMORY REDUNDANCY CIRCUIT FOR HIGH DENSITY MEMORY, invented by Nien ChaoYang, Chung Ju Chen and Chung Jung Lin, filed on the same day as the present application, having Application No. <not yet assigned>, and assigned to the same assignee as the present application.

BACKGROUND OF THE INVENTION

1. Field of the Invention

The present invention relates to integrated circuit memory design, and more particularly to circuitry for providing on chip redundancy for high density memory arrays such as mask read only memory ROM.

2. Description of Related Art

In the manufacture of integrated circuit memory devices, it is common to provide a redundant segment of memory in addition to the main array, which can be used as a replacement for defective segments of the array. Thus, additional rows or columns of memory cells are provided on an integrated circuit memory device. After manufacturing of the device, it is tested to determine whether all segments of the main array are in good condition. If any segment of the array fails the testing, then it may be replaced by the redundant segment by storing an address on the chip characterizing the failed segment, and, using circuitry which is responsive to the stored address to access the additional segment in place of the defective one. This process significantly improves manufacturing yield for memory circuits.

Substantial prior art in this field is represented for instance by U.S. Pat. No. 3,753,244, U.S. Pat. No. 4,047,163, U.S. Pat. No. 4,250,570, and publications such as McKinney, "A 5V 64K EPROM Utilizing Redundant Circuitry", 1980 IEEE International Solid-State Circuits Conference, pages 146–147.

One field in which redundancy has not been widely applied is in the field of high density read-only memory ROM devices, such as mask ROM. Because the ROM cells in a mask ROM are programmed using a manufacturing step, it is impossible to use other mask ROM cells as an additional replacement segment. This is true because the additional segment of ROM cells can not be programmed after testing with the data from the failed segment. Thus, unlike programmable memory devices, in which the memory elements of the array are designed to be programmed after manufacturing, and in which redundant elements are easily utilized, read-only memory circuits do not readily allow the use of redundancy.

It has been proposed to use single polysilicon floating gate transistors as redundancy elements for mask ROM. See for example, co-pending U.S. Patent application entitled MEMORY REDUNDANCY CIRCUIT USING SINGLE POLYSILICON FLOATING GATE TRANSISTORS AS REDUNDANCY ELEMENTS, invented by Yiu, et al., filed Apr. 2, 1997, having application Ser. No. 08/825,873 (PCT application number PCT/US96/17300). One problem associated with the layout of floating gate transistors as redundancy elements for mask ROM is that the mask ROM is a very dense memory structure. Thus, in order to fit within the array structure of a mask ROM array, the floating gate redundancy elements must be laid out in a very compact fashion. This has prevented efficient implementations of mask ROM arrays with floating gate redundancy elements in the prior art. However, an EPROM like cell based on a single layer polysilicon floating gate transistor, that is programmed by hot electron injection is a good way to replace abnormal core cells in a mask ROM array.

As the density of memory arrays shrinks, and the need to improve yield is increased, applying redundant elements to read-only memory devices is desired. However, the redundant elements must be compact and compatible with the ROM manufacturing process, so that the cost of implementing the redundant elements does not outweigh any gains in manufacturing yield achieved by the redundancy.

SUMMARY OF THE INVENTION

The present invention provides a redundancy architecture suitable for high density integrated circuit memory, such as mask ROM. The redundancy architecture is based on a two transistor redundancy cell that has a very small layout relative to the prior art. Both row and column failure modes can be repaired using the redundancy architecture of the present invention. Furthermore, the redundancy architecture of the present invention can be manufactured using typical single metal, single polysilicon, mask ROM processes.

According to another aspect of the invention, the memory used to characterize the failed row or column is implemented using an extra column or row respectively which is manufactured in a compact layout adjacent the array. This saves significantly in space on the integrated circuit, because it illuminates the need for an extra content addressable memory array in the device for registering the addresses of failed rows or columns. In a preferred system, both an extra column and an extra row are laid out adjacent the array, using novel two transistor floating gate cells. Mode select logic is included by which replacement of a row or a column is selected for the device. In the replacement row mode, a memory cell in the extra column is used to indicate the row to be replaced, and to enable the reading of the data from the replacement word line in place of the failed row. In the replacement column mode, a memory cell in the extra row is used to indicate the column to be replaced, and to enable the sensing of data from the replacement column in place of the failed column in the array.

Thus, the present invention provides an integrated circuit memory that comprises an array of read only memory cells having a set of bit lines and a set of word lines coupled with the array. A plurality of sense amplifiers is coupled to the set of bit lines which sense data values stored in the array in selected columns in response to addresses. A plurality of word line drivers is coupled to the set of word lines, and drive a read potential to rows of memory cells in the array in response to addresses. A column of electrically programmable memory cells is coupled to the set of word lines, and include an extra bit line coupled to the column of electrically programmable memory cells and an extra sense amplifier coupled to the extra bit line. A row of electrically programmable memory cells is included and coupled to the set of bit lines. The row includes an extra word line coupled to the row of electrically programmable memory cells and an extra word line driver coupled to the extra word line. Logic is included coupled to the extra sense amplifier and the extra word line driver which is responsive to data stored in an electrically programmable memory cell in the extra column and coupled to a particular word line in the set of word lines as indicated by the output of the extra sense amplifier to enable the plurality of sense amplifiers to output data from the extra row as a replacement for the particular row in the array. Alternatively, logic is coupled to the extra sense amplifier and the extra word line driver which is responsive to data stored in the electrically programmable memory cell in the extra row, and coupled to a particular bit line in the set of bit lines as indicated by the output of a sense amplifier in the plurality of sense amplifiers, and to the output of the extra sense amplifier to output data from the extra column as a replacement for the particular column in the array. As mentioned above, in a preferred embodiment mode select circuits are included to select either the column replacement or the row replacement modes.

The present invention also provides for use of the novel floating gate memory cells in a redundant row or a redundant column in the array. Thus, the present invention also provides an integrated circuit memory comprising an array of memory cells, a set of bit lines coupled with the array and a set of word lines coupled with the array. A buried diffusion word line is implemented by implants diffused in the substrate adjacent the array, and parallel to the word lines in the set of word lines. A redundant word line is adapted to replace a word line in the set of word lines coupled to an abnormal core cell. The redundant word line is spaced away from the buried diffusion word line. First and second buried diffusion regions between the buried diffusion word line and the redundant word line, and a channel region between the first buried diffusion region and a second buried diffusion region form part of the redundant cell. A floating gate member is arranged to overlie a segment of the buried diffusion word line, and to extend between the buried diffusion word line and a redundant word line around the first buried diffusion region and over the channel region between the first diffusion region and the second buried diffusion region. A third buried diffusion region adjacent the redundant word line opposite the second buried diffusion region is arranged so that the second buried diffusion region acts as a source terminal, the third buried diffusion region acts as a drain terminal, and the redundant word line acts as a gate of a transistor. A first contact is made between the first buried diffusion region and a first bit line in the set of bit lines, and a second contact is made between a third buried diffusion region and a second bit line in the set of bit lines.

In a preferred system, the word lines in the set of word lines comprise conductive materials such as polysilicon, and the redundant word line comprises the same conductive material, and can be implemented with the same mask steps. The set of bit lines comprise metal lines formed in a metal layer overlying the polysilicon layer. The first and second contacts comprise contacts between the first and third buried diffusion regions and the first and second bit lines in the metal layer. According to another aspect of the invention, the bit lines in the set of bit lines comprise essentially straight conductors overlying the array of memory cells, and the set of word lines. The first and second bit lines include essentially straight extensions of the bit lines to the first and second contacts, respectively, in the redundancy cell.

In an integrated circuit memory, a plurality of redundancy cells are implemented as discussed above, all fitting within the horizontal pitch of the memory array, because the layout supports straight extensions of the bit lines over the redundancy cells. More than one row of redundancy cells may be required to replace a full row of mask ROM cells, for example when there are two mask ROM cells for every metal bit line.

According to an alternative embodiment, the redundancy cells are arranged to provide a replacement column. According to this embodiment, the buried diffusion word line is arranged essentially parallel with extensions of the word lines of the array. Word lines in the array have essentially straight extensions over the channel region of the transistors in the redundancy cell.

According to yet another embodiment of the present invention, both a redundant column and a redundant row are implemented in association with a single array of memory cells.

The redundancy architecture of the present invention is compact and highly efficient in layout for ease of manufacture with high density mask ROM devices. By providing efficient redundancy, the manufacturing yield for mask ROM will be greatly improved.

Other aspects and advantages of the present invention can be seen upon review of the figures, the detailed description and the claims which follow.

DETAILED DESCRIPTION

Figure 1:
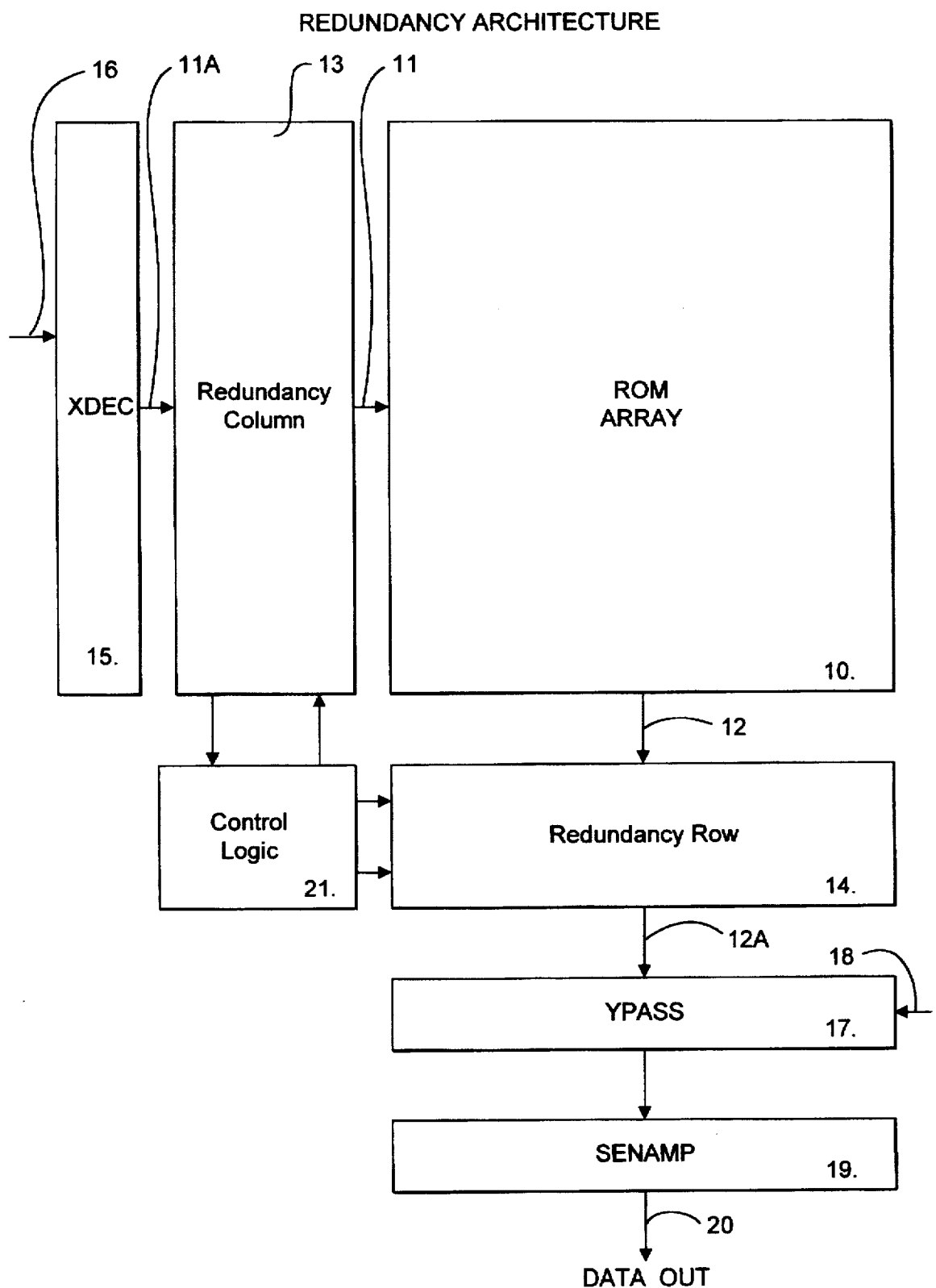
FIG. 1 is a simplified block diagram of a mask ROM integrated circuit memory including a replacement row and a replacement column of electrically programmable memory cells according to the present invention with a selectable row replacement mode or column replacement mode.

A detailed description of preferred embodiments of the present invention is provided with respect to the figures, in which FIG. 1 illustrates basic architecture of the present invention.

FIG. 1 shows a read-only memory device having row and column redundancy using electrically programmable cells according to the present invention. Thus, the device includes a mask ROM array 10 such as described in U.S. Pat. No. 5,117,389 entitled FLAT CELL READ-ONLY INTEGRATED CIRCUIT invented by Tom D. H. Yiu. Other read only memory architectures could be utilized as well, including read only memory arrays which are programmed using techniques other than mask programming.

According to the redundancy architecture as shown in FIG. 1, the array includes a set of word lines 11 and a set of bit lines 12 by which individual cells in the array are accessed. An extra column 13 and an extra row 14 are implemented on the device, adjacent the array 10. The extra column 13 includes a column of electrically programmable memory cells which are coupled to the set of bit lines 11 by extensions 11A of the word lines. The extensions 11A of the word lines are coupled to a row decoder 15 which is responsive to addresses on line 16 to drive word lines in the set 11 of word lines in the array. In the illustration, the word lines in the set 11 are driven through the extensions 11A of word lines which are coupled to the extra column 13.

The extra row 14 is coupled to extensions 12A of the set 12 of bit lines in the array, such that at least one electrically programmable memory cell is coupled to each bit line in the set 12 of bit lines. The extensions 12A of the bit lines are coupled to a column decoder 17 which is responsive to addresses on line 18 to select a particular column in the array. A plurality of sense amplifiers 19 is coupled to the column decoder 17 to supply data on line 20 as output.

According to the present invention, control logic 21 is included which for row replacement includes an extra sense amplifier for the extra column 13 and an extra word line driver for the extra row 14. The logic is responsive to data stored in a memory cell in the extra column 13 and coupled to a particular word line in the set 11 of word lines as indicated by output of the extra sense amplifier to enable the plurality of sense amplifiers to output data from the extra row 14 as a replacement for the particular row in the array. In the column replacement mode the logic is responsive to data stored in a memory cell in the extra row 14 and coupled to a particular bit line in the set of bit lines 12 as indicated by output of a sense amplifier in the plurality of sense amplifiers 19, and to output of the extra sense amplifier in the control logic 21, to output data from the extra column 13 as a replacement for the particular column in the array. Also, in a preferred system, the control logic 21 includes a mode selection circuit, such as a content addressable memory cell which is set during manufacture to enable either replacement row or replacement column mode for the device.

Thus, during testing of a ROM device as shown in FIG. 1, a defective row in the ROM array 10 may be detected. The defective row address or column address is stored in the programmable store (the extra column 13 or the extra row 14, respectively in the preferred system), and the data from the defective row is programmed into the replacement row 14 by means of access provided by programming control circuitry (not shown). This access may be provided using special pins for providing programming potentials for the floating gate cells, using charge pumps on chip that allow the generation of programming voltages based on the standard supply voltages, or other techniques known in the art.

The redundancy circuitry shown in FIG. 1 is based on the storage of defective row or column addresses in the extra column or row respectively. Alternative systems use defective address storage elements, address comparators, and an address input buffer. Alternative logic circuits which operate to utilize the replacement row or column in place of a defective row or column in the array can be implemented as known in the art.

Figure 2:
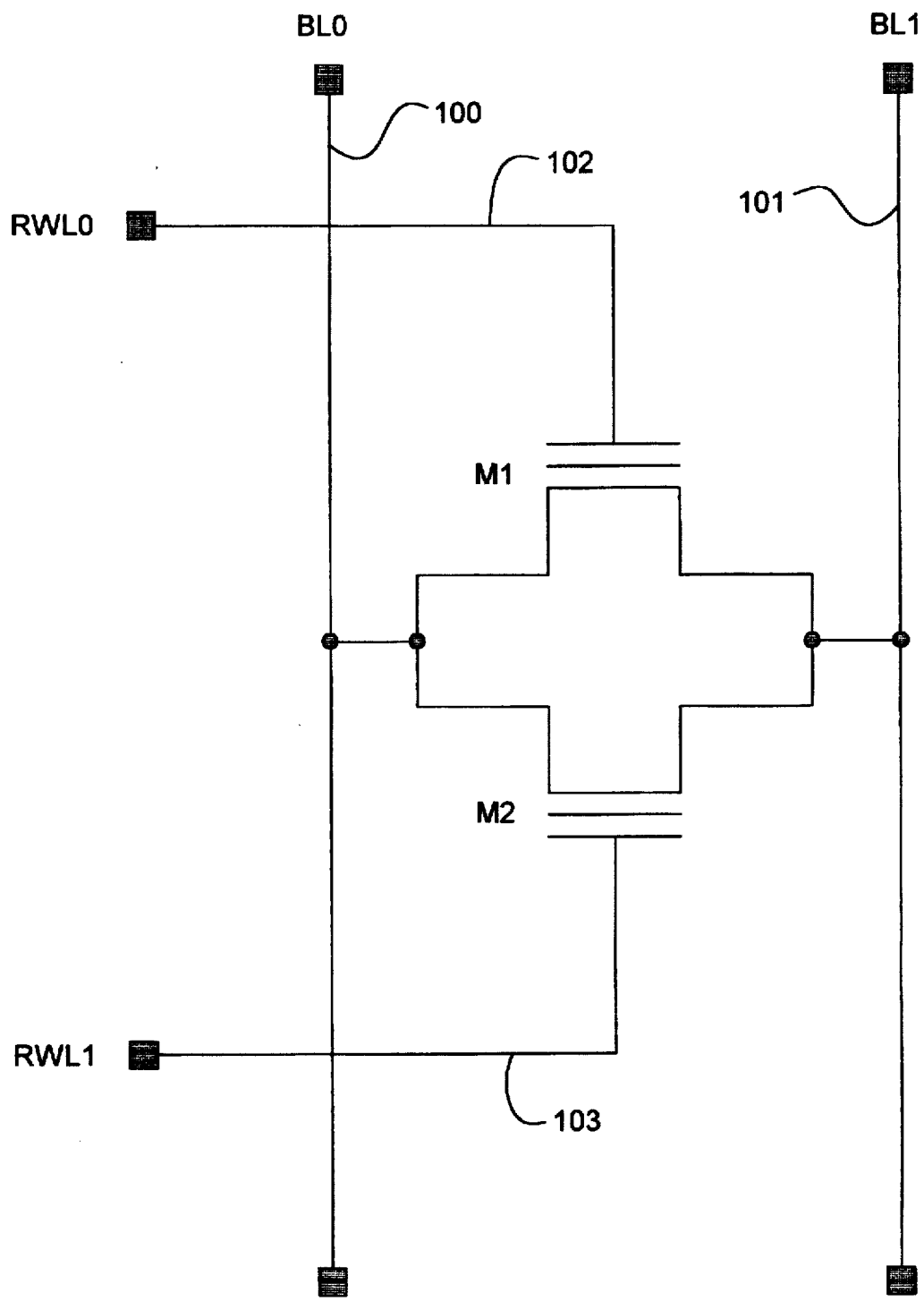
FIG. 2 illustrates the design of a prior art floating gate redundancy cell.
Figure 3:
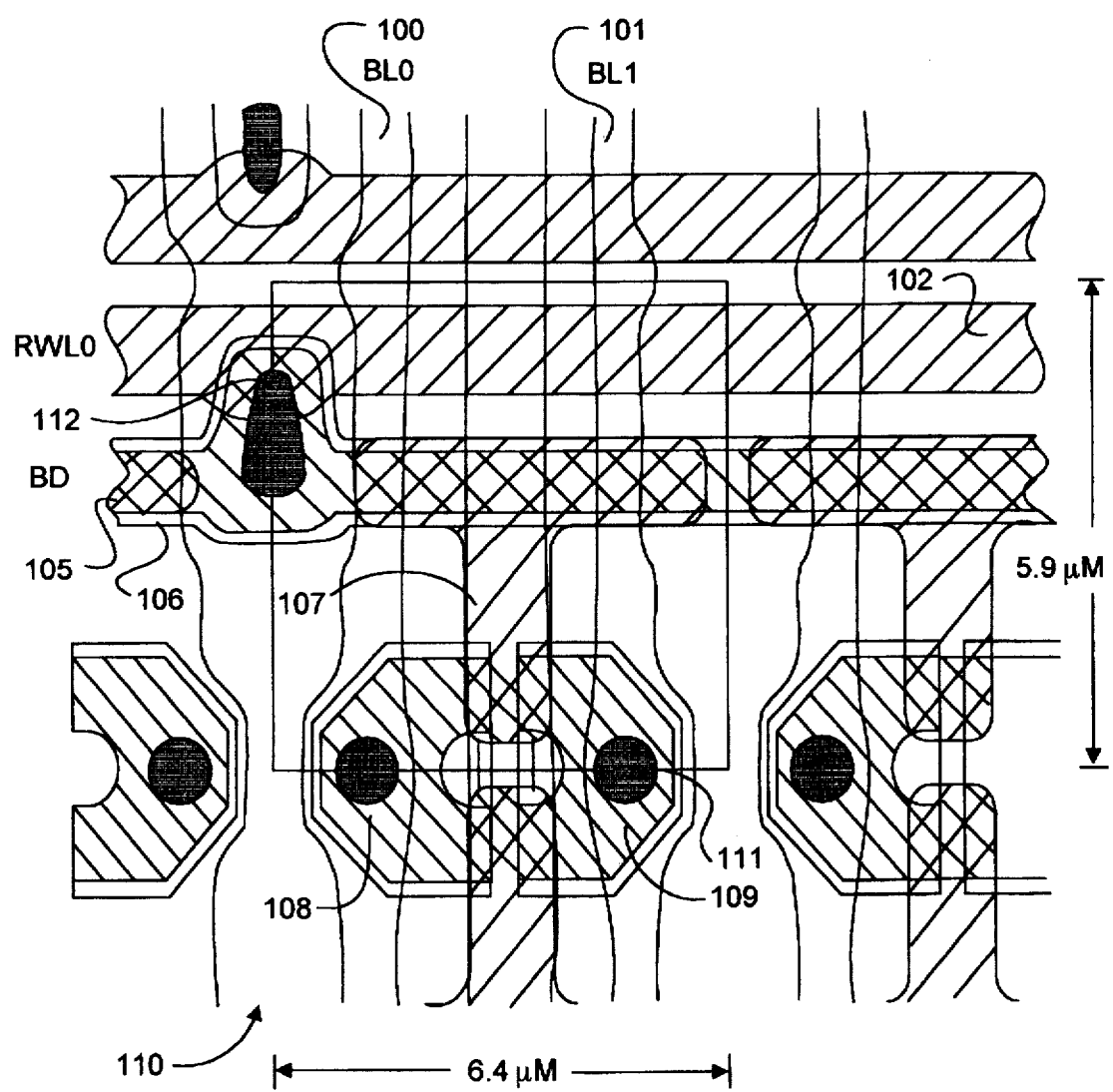
FIG. 3 illustrates the layout of the prior art floating gate redundancy cell of FIG. 2 in one example system.

FIGS. 2 and 3 illustrate the circuit and layout of two redundancy cells based on flat, single floating gate transistors according to the prior art. The redundancy cells as shown in FIG. 2 are coupled to a first bit line 100 and a second bit line 101 from the memory array with which it is associated. The drain of a first floating gate transistor M1 and the drain of a second floating gate transistor M2 are coupled to the first bit line 100. The source of the floating gate transistor M1 and the source of the floating gate transistor M2 are coupled to the second bit line 101. Redundant word lines 102 and 103 are coupled respectively to the control gates of the transistors M1 and M2. The floating gate is formed by a single layer of polysilicon. The control gate includes a buried diffusion control gate coupled to the redundant word lines by a butting contact as described below.

FIG. 3 illustrates the layout of the cell of FIG. 2. As can be seen in FIG. 3, a redundant word line 102 is implemented with a polysilicon line overlying the array. A buried diffusion line 105 essentially parallel with the redundant word line 102 is laid out across the array. The buried diffusion line 105 is an isolated p-type diffusion line, implemented in an n-type well 106. A "T shaped" floating gate 107 has a first region overlying the buried diffusion region 105, and a second region which extends downward over the channel region of the floating gate memory cell. A buried diffusion region 108 provides the source of the floating gate memory cell, and a buried diffusion regions 109 provides the drain of the floating gate memory cell. A channel region underlies the floating gate 107. Metal contacts 110 and 111 provide contact between the buried diffusion regions 108 and 109 and the metal bit lines 100 and 101.

The buried diffusion region 105 contacts the redundant word line 102 by a butting contact 112 implemented by a metal plug which extends from the buried diffusion region to the polysilicon redundant word line. In this prior art redundancy cell, in addition to the butting contact provided by a metal region 112, the metal contacts 110 and 111 are used to contact the metal bit lines. While this cell fits between the bit lines 100 and 101, it is relatively large in layout.

The area of the cell according to this prior art design is about 5.9 microns high by about 6.4 microns wide.

It is desirable to provide an even more compact floating gate redundancy cell. In addition, it is desirable to provide a redundancy cell architecture suitable for use in implementing a redundancy column.

Figure 4:
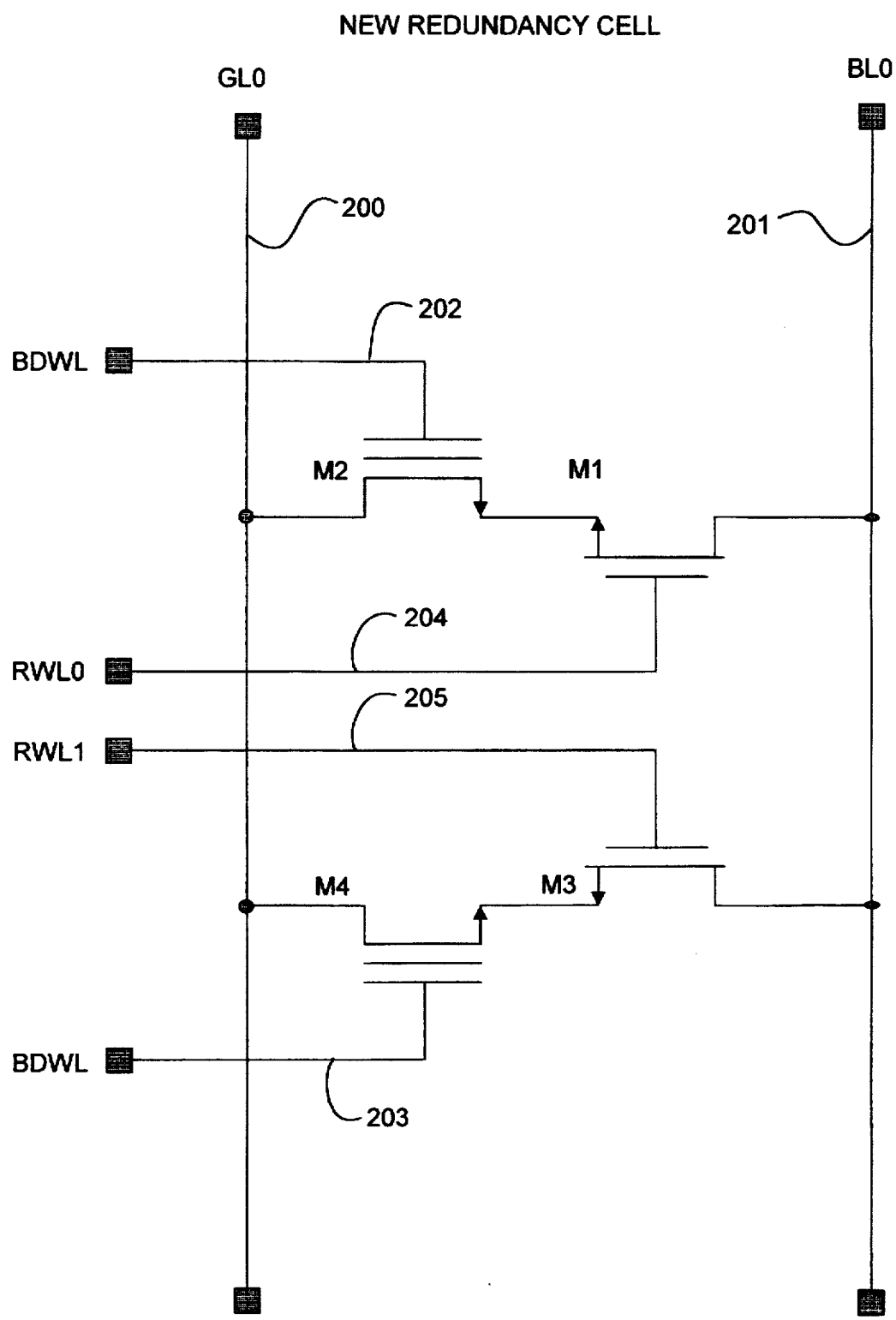
FIG. 4 illustrates the two transistor, floating gate cell of the present invention.

FIG. 4 illustrates the redundancy cell of the present invention. In FIG. 4, two cells are illustrated between a first bit line 200 and a second bit line 201. In the embodiment shown, the first bit line 200 is a ground line and the second bit line 201 is a data line. The first redundancy cell is composed of the floating gate transistor M2 and the pass gate transistor M1. The drain of transistor M2 is coupled to the first bit line 200. The source of the transistor M2 is connected to the source of the transistor M1. The drain of transistor M1 is connected to the second bit line 201. A buried diffusion word line 202 acts as the control gate of the floating gate cell M2.

A mirror image cell is also illustrated in FIG. 4 composed of floating gate cell M4 and pass transistor M3. The drain of floating gate transistor M4 is connected to the first bit line 200. The source of the floating gate transistor M4 and the source of the floating gate transistor M3 are coupled together. The drain of the pass transistor M3 is connected to the second bit line 201. The control gate of the floating gate transistor M4 is connected to a second buried diffusion line 203. Redundant word lines 204 and 205 are connected to the gates of the pass transistors M1 and M3, respectively.

The pass transistors M1 and M3 are controlled by the redundant word lines. To access a cell, the redundant word lines are energized, as well as the buried diffusion word lines.

Figure 5:
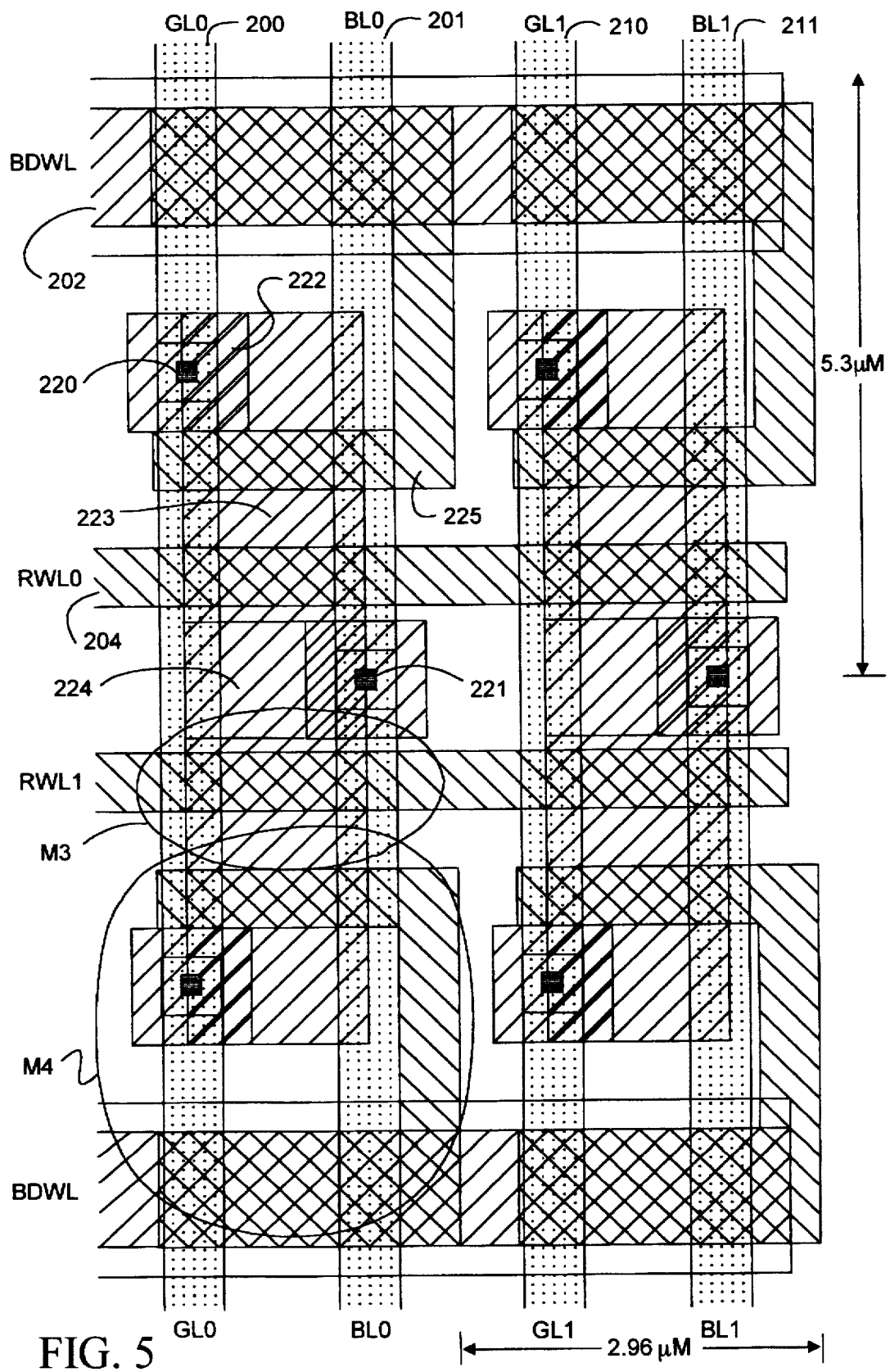
FIG. 5 illustrates the layout of the two transistor, floating gate cell of the present invention.

The layout of the redundancy cell shown in FIG. 4 is illustrated in FIG. 5. FIG. 5 shows four cells coupled to a set of four bit lines including bit line 200, bit line 201, bit line 210, and bit line 211. These bit lines overlay the top of the array, and comprise essentially straight extensions out of the mask ROM array of the bit lines. Contacts 220 and 221 provide contact to a first cell between the bit line 200 and the bit line 201. The contact 220 is coupled to a buried diffusion region 222. A second buried diffusion region 223 lies between the contact 220 and the contact 221. A third buried diffusion region 224 is coupled through the contact 221 to the metal line 201. A channel region divides the buried diffusion region 224 from the buried diffusion region 223. The redundant word line 204 overlies the channel region between the buried diffusion region 224 and the buried diffusion region 223. This establishes a transistor corresponding to transistor M1 of FIG. 4. Also, a channel region divides the buried diffusion region 223 from the buried diffusion region 222. A polysilicon floating gate structure 225 as an extension overlying the channel region between the buried diffusion region 222 and the buried diffusion region 223. It extends around the buried diffusion region 222 to the buried diffusion word line 202. The floating gate region 225 includes a segment which extends over the buried diffusion word line 222 between the first bit line 200 and the second bit line 201. Buried diffusion word line 202 acts as a control gate for the flat floating gate cell by capacitive coupling through the floating gate element 225 to the channel region between the buried diffusion region 222 and the buried diffusion region 223. The transistor M3 and the floating gate transistor M4 are laid out in a mirror image fashion around the contact 221.

A similar column of cells is also illustrated between the bit lines 210 and 211. The redundancy cell according to the layout shown in FIG. 5 for 0.4 micron mask ROM process, has a height of about 5.3 microns and a width of about 2.96 microns. The width is less than half the width of the prior art cell in FIG. 3.

The redundancy cell of FIG. 5 does not have the butting contact of the prior art cell shown in FIG. 3. This allows much more compact layout so that the cell can fit under current flat read only memory bit line metal without any modification to the decoder structures. Furthermore, the layout area is about one-half of the prior art, for a 0.4 micron flat ROM process. The cell of FIG. 5 does consume slightly greater current than the prior art cell of FIG. 3. However, the difference is not significant enough to degrade normal timing.

Figure 6:
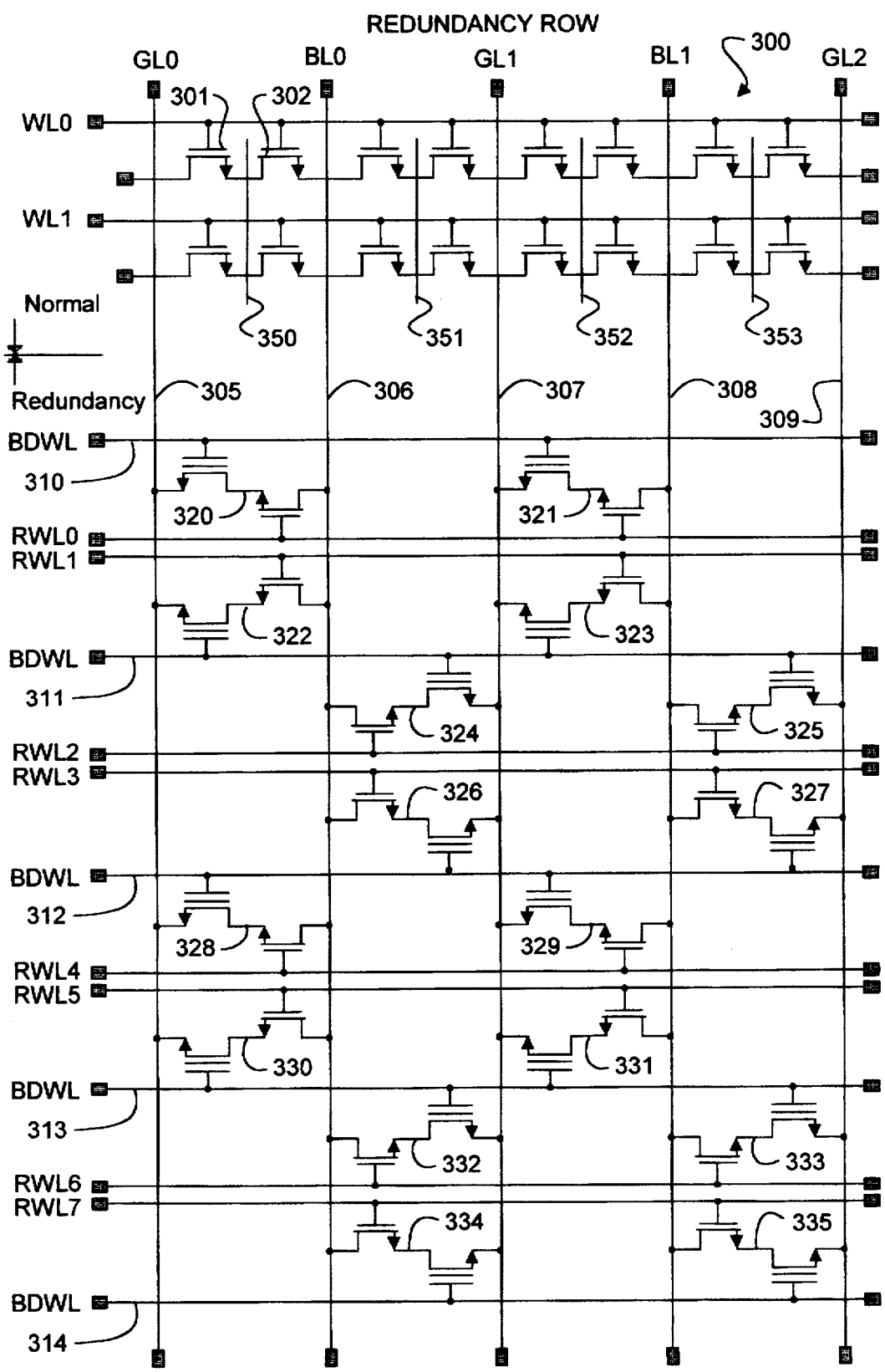
FIG. 6 is a schematic diagram of a mask ROM integrated circuit having a replacement row implemented according to the present invention.

FIG. 6 illustrates the implementation of a replacement row according to the present invention. FIG. 6 illustrates a portion of an array 300 of mask ROM cells. The array 300 includes a set of word lines WL0, WL1, and a set of bit lines GL0, BL0, GL1, BL1, GL2 . . . Between each pair of bit lines, e.g. GL0 and BL0, there are two flat ROM cells 301 and 302. The flat ROM cells are implemented for example as described in U.S. Pat. No. 5,117,389. In the array 300 there are local bit lines 350, 351, 352 and 353 which are accessed using right and left bank select transistors as described in the cross referenced U.S. Pat. No. 5,117,389.

The bit lines include respective straight extensions from the array 300 into the replacement segment of the integrated circuit. The replacement segment includes a plurality of buried diffusion word lines, including buried diffusion word lines 310, 311, 312, 313 and 314. The buried diffusion word lines are laid out essentially parallel with the word lines WL0 and WL1 in the array 300. Spaced away from the buried diffusion word lines, and laid out in parallel are a plurality of redundant word lines RWL0–RWL7. The redundant word lines are implemented in polysilicon, like the word lines WL0 and WL1 in the array 300. Redundancy cells are implemented as described above with respect to FIGS. 3 and 4. Thus, there is a redundancy cell 320 and a redundancy cell 321 between the buried diffusion word line 310 and the redundant word line RWL0. Redundancy cell 322 and redundancy cell 323 are laid out between the buried diffusion word line 311 and the redundant word line RWL1. Redundancy cells 324 and 325 lie between the buried diffusion word line 311 and the redundant word line RWL2. Redundant cells 326 and 327 are laid out between the redundant word line RWL3 and the buried diffusion word line 312. Redundant cells 328 and 329 are laid out between the buried diffusion word line 312 and the redundant word line RWL4. Redundant cells 330 and 331 are laid out between the redundant word line RWL5 and the buried diffusion word line 313. Redundant cells 332 and 333 are laid out between the buried diffusion word line 313 and the redundant word line RWL6. Redundant cells 334 and 335 are laid out between the redundant word line RWL7 and the buried diffusion word line 314. Thus in the array there are sixteen redundant cells, coupled with eight redundant word lines. This provides resources for replacing two defective rows in the array 300.

To control the array, all of the buried diffusion word lines 310–314 are coupled together, or driven in parallel. The redundant word lines RWL0–RWL8 control eight redundancy arrays for replacement of two normal word lines. The redundant word lines RWL0 and RWL2 are driven together in the read mode by which also redundant word lines RWL1 and RWL3 are driven together. Redundant word lines RWL4 and RWL6 are driven together while redundant word lines RWL5 and RWL7 are driven together. In the main array 300, because there are two cells for every bit line, there is a bank left and bank right decoding structure implemented, as known in the prior art. The left and right decoding according to the implementation of FIG. 7 is used to drive the redundant word lines RWL0 or RWL2 to select the cell 320 on the left or the cell 324 on the right of bit line BL0.

Thus as can be seen in FIG. 5, the horizontal pitch of the redundancy cells fits easily within the layout of the set of bit lines used with the array 300. The bit lines are provided with straight extensions through the redundancy column, and the column is laid out for easy decoding for replacement of abnormal rows in the array 300.

Figure 7:
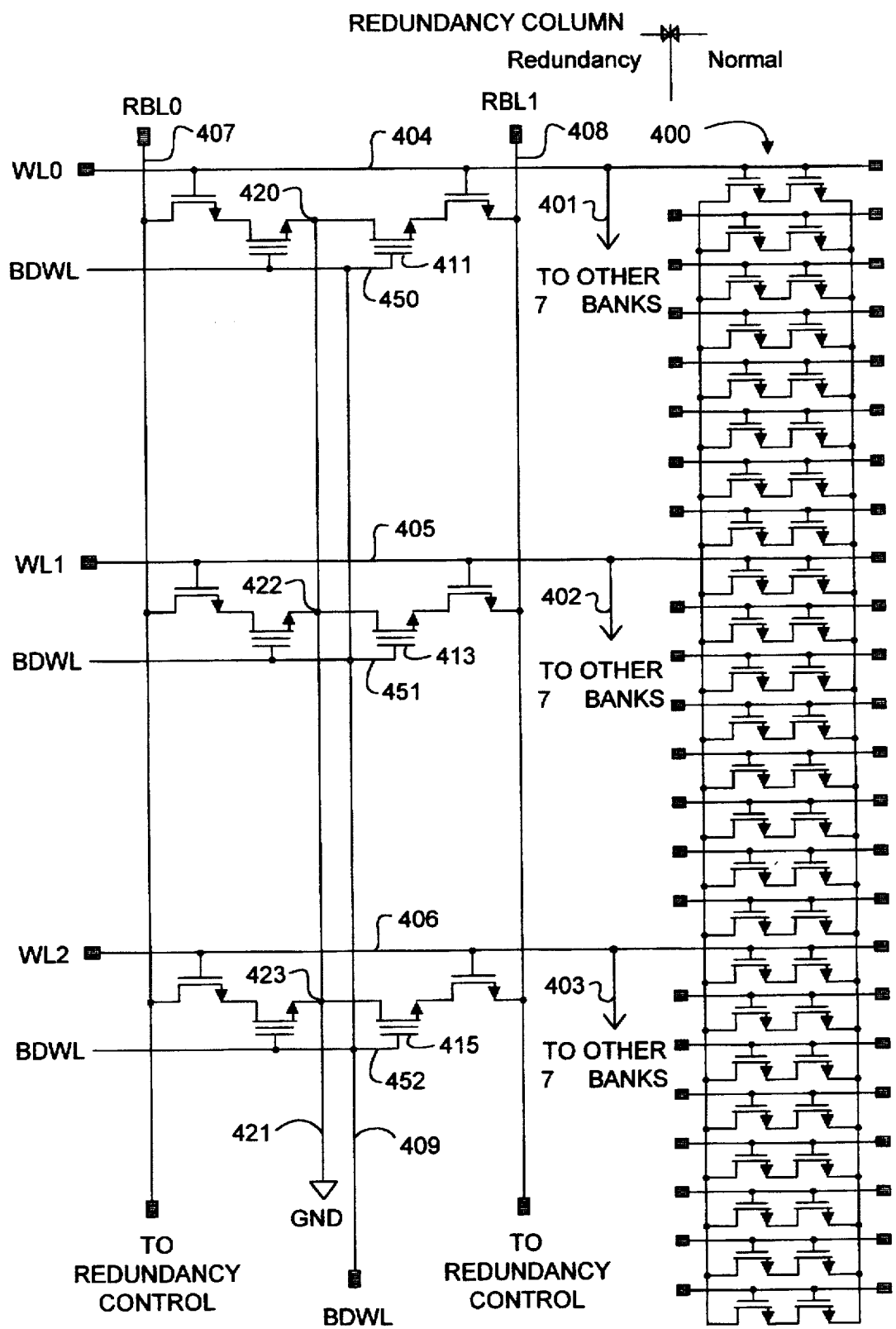
FIG. 7 is a schematic diagram of a mask ROM integrated circuit having a replacement column according to the present invention.

FIG. 7 illustrates the layout of the device using a replacement column. According to this embodiment the array 400 is implemented as described in the U.S. Pat. No. 5,117,389. There are a plurality of word lines. Word line drivers are shared by with eight word lines, for example rows. Thus, the word line WL0 is coupled as indicated at line 401 to rows of cells in seven other banks. Thus, the vertical pitch of the redundancy cell fits between the drivers if it is smaller than the vertical pitch of eight rows in the array, as is accomplished with the cell of the present invention. Word line WL1 is coupled as indicated at arrow 402 to word lines in seven other banks of cells. Also, word line WL2 is coupled as shown at arrow 403 to seven other banks of cells. Word line WL0 includes a straight extension 404 into the replacement column. Also, word line WL1 includes straight extension 405. Word line WL2 includes a straight extension 406. Redundant bit lines, including a first redundant data line 407, a second redundant data line 408 and ground line 421, are implemented on the device. The redundant bit lines comprise metal lines like the bit lines in the main array. The buried diffusion word lines are laid out in the array substantially parallel with the word lines WL0–WL2, and provide control gates for the floating gate transistors in the redundancy cells 410–415. All the buried diffusion word lines BDWLs are coupled together by line 409. The redundancy cell 410 and 411 share a contact 420 to a ground line 421. Redundant cells 412 and 413 share a contact 422 to the ground line 421. Redundant cells 414 and 415 share a contact 423 to the ground line 421. The redundant bit lines 407 and 408 are coupled to the redundancy control for use in implementing replacement columns. According to the layout of FIG. 7, if one column in the main array is to be replaced, eight sets of redundant columns are needed. Only two columns are shown in FIG. 7.

FIGS. 8, 9, 10 and 11 illustrate the control logic used for row and column replacement according to the present invention, in which for row replacement the extra column is used to identify the failed row, and for column replacement the extra row is used to identify the failed column.

Figure 8:
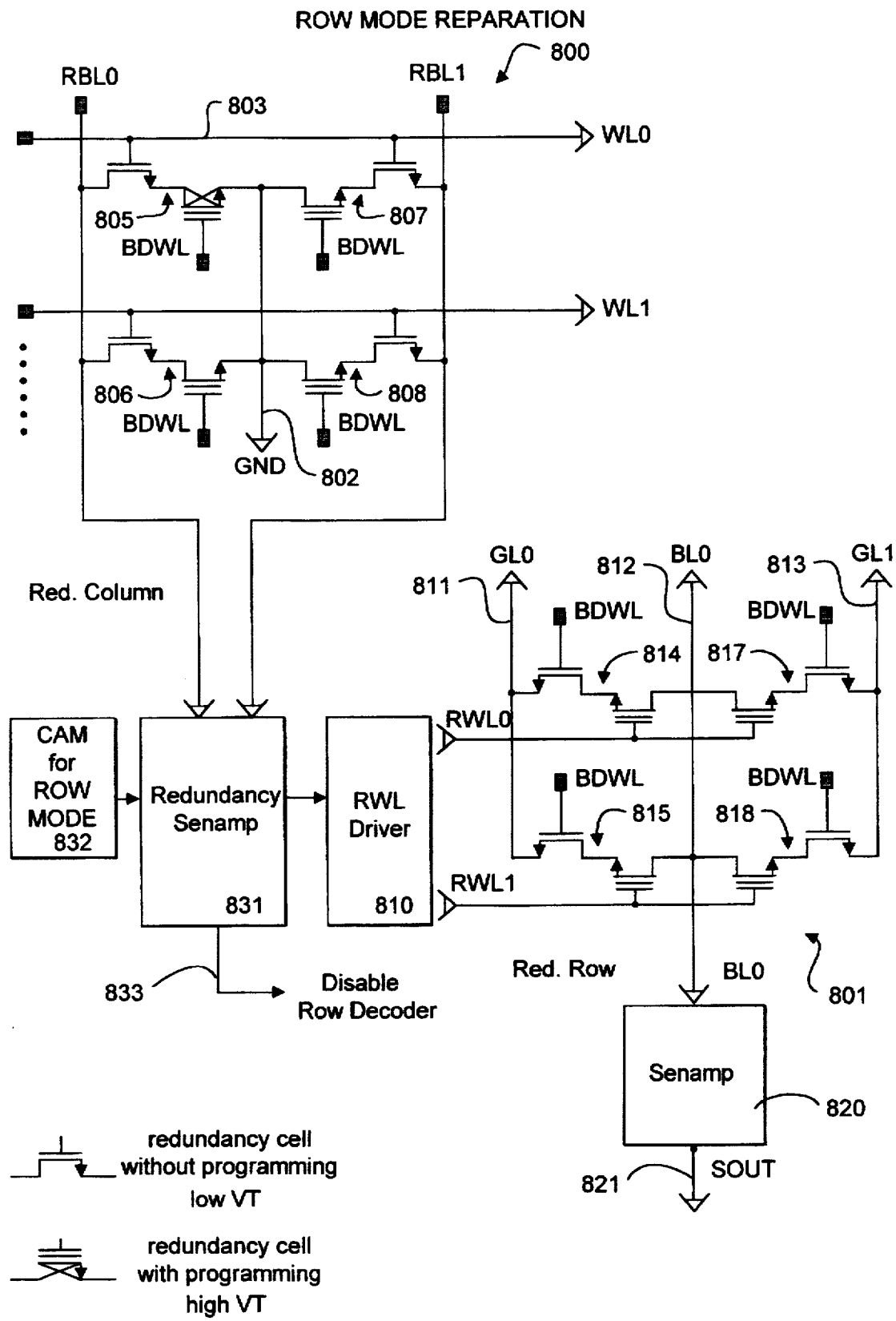
FIG. 8 is a schematic diagram illustrating operation of the present invention in a row replacement mode.
Figure 9:
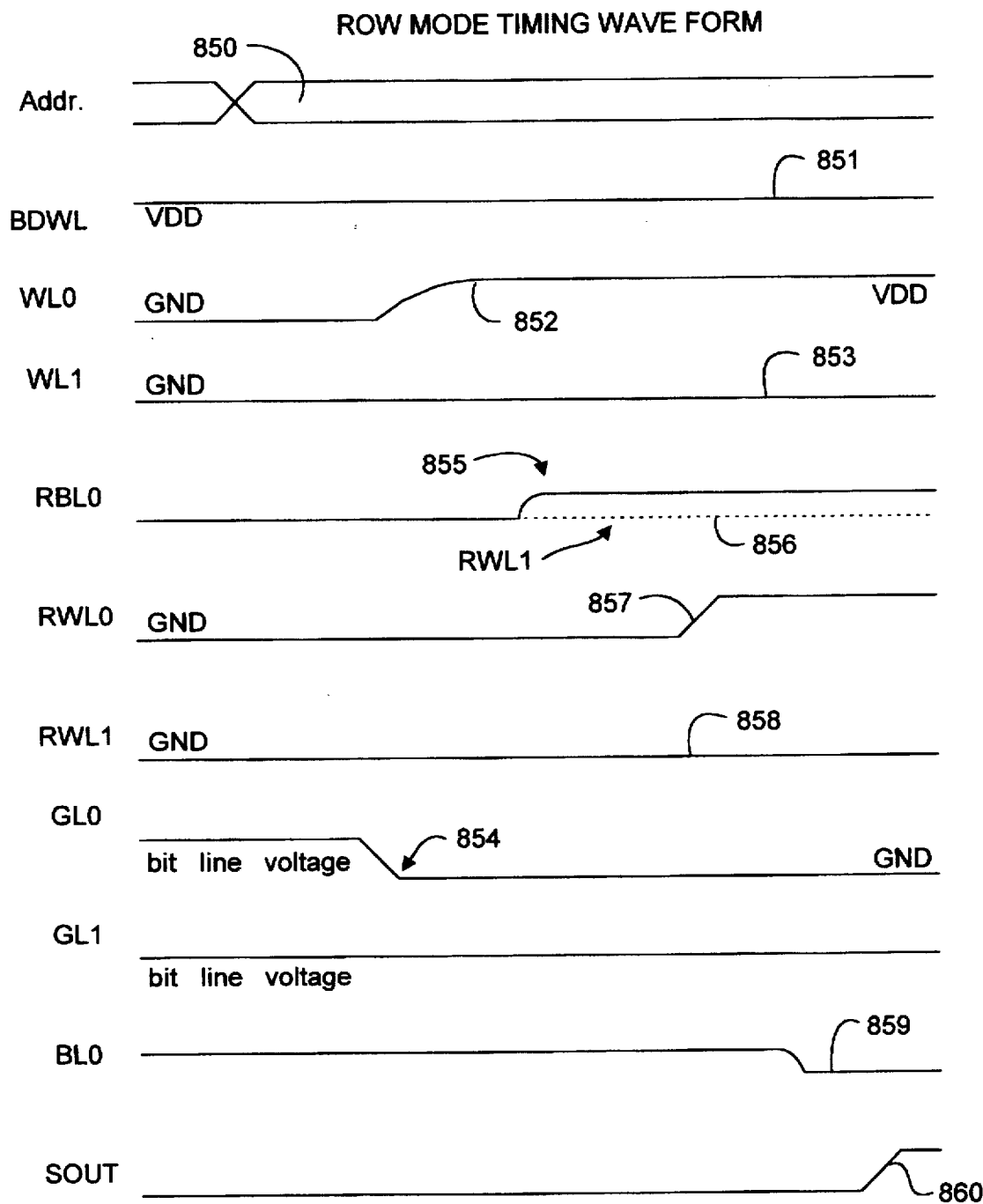
FIG. 9 is a timing diagram illustrating operation of the row replacement mode of FIG. 8.

Reference is made to FIG. 8 and FIG. 9 to illustrate the operation for row replacement. In FIG. 8, replacement column cells are indicated in block 800 and replacement row cells are indicated in block 801. In the replacement column block 800, a redundant bit line RBL0, a ground bit line 802, and a redundant bit line RBL1 are illustrated. Word lines WL0 and WL1 in the array are shown with extensions 803 and 804 through the redundant column block 800. A first cell 805 and a second cell 806 are connected between the ground line 802 and bit line RBL0. A third cell 807 and a fourth cell 808 are coupled between the ground line 802 and bit line RBL1. In this example, cell 805 is programmed with a high threshold while cells 806, 807 and 808 have a low threshold.

In the replacement row block 801, redundant word line RWL0 and redundant word line RWL1 are coupled to a replacement word line driver 810. Also, the cells in the replacement row 801 are coupled to bit lines including ground line GL0, data line BL0, and ground line GL1 in the main array. By extensions 811, 812 and 813 respectively. Thus in the redundant row block 801, the cells 814 and 815 are connected between bit lines GL0 and BL0 and to respective redundant word lines RWL0 and RWL1. Cells 816 and 817 are coupled between bit line BL0 and bit line GL1, and to the redundant word lines RWL0 and RWL1 respectively. The bit lines including bit line BL0 are coupled to sense amplifiers schematically represented by block 820. Of course, in the actual system column select circuitry and other circuits are included between the array and the sense amplifier which supply the sensed data out on line 821, for this example.

The control logic according to the present invention in addition to the redundant word line driver 810 includes extra sense amplifiers 831 and a mode select circuit 832. The extra sense amps 831 are coupled to the redundant bit lines RBL0 and RBL1.

Timing of the operation of the circuitry in the row mode is illustrated in FIG. 9. In FIG. 9, an address for accessing the main array becomes valid during a time interval 850. The buried diffusion word lines for the redundant row and redundant column are held at a high potential as indicated at trace 851. Row decoding results in, for this example, word line WL0 being driven to a read potential at time 852 while word line WL1 remains ground as indicated by trace 853. At time 854, the bit line GL0 is driven to ground while the bit line BL0 remains at the read precharge potential in order to select the column between bit lines GL0 and BL0. For row replacement, the state of the cell 805 coupled to replacement bit line RBL0 and to word line WL0 is sensed at point 855. Because the cell 805 has a high threshold, sense amp 831 will cause redundant word line RWL0 to be driven to a read potential at point 857.

Redundant bit line RBL1 remains at the ground potential as indicated by trace 856. Redundant word line RWL1 remains at the ground potential as indicated by trace 858.

At the same time as driving the redundant word lines, the row decoder for the word lines WL0 and WL1 is disabled. This causes the sense amplifier circuitry 820 to sense the data on bit line BL0 at point 859 with the resulting data output at time 860 being read from the replacement row 801. In this case, the replacement cell 814 on redundant word line RWL0 is selected as a replacement for the ROM cell addressed by word line WL0 and found between bit lines GL0 and BL0.

The logic coupled to the sense amps 831 also generates a signal on line 833 to disable the row decoder for the normal array when it is detected that a particular row is to be replaced by the extra row 801.

In this embodiment of the present invention, for each replacement row, there must be a replacement column which can be programmed with a bit to indicate the particular row in the array for which the replacement row is to be used.

Figure 10:
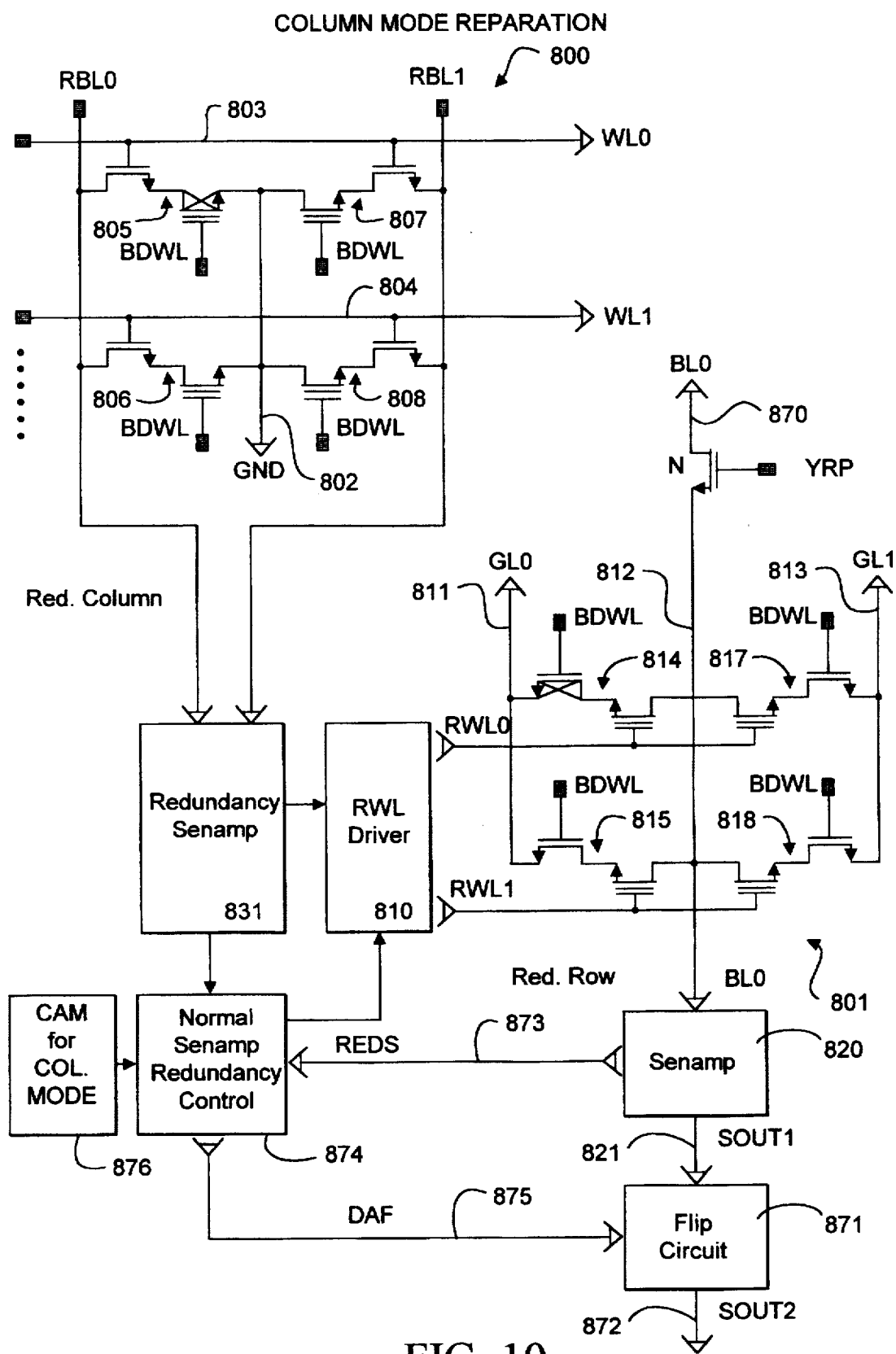
FIG. 10 is a schematic diagram illustrating operation of the present invention in a column replacement mode.
Figure 11:
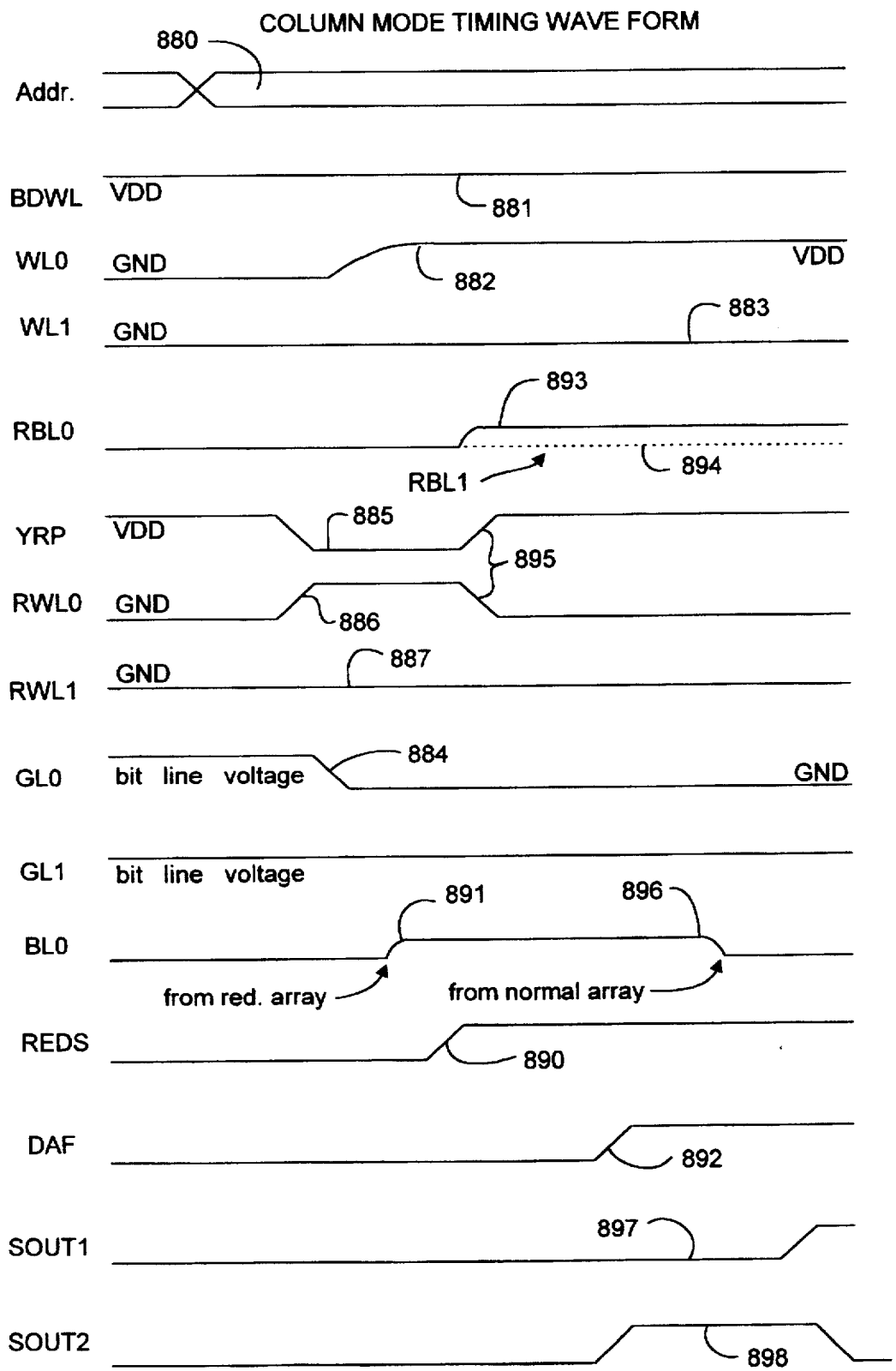
FIG. 11 is a timing diagram illustrating operation of the circuit of FIG. 10 for column replacement mode.

Column replacement can be understood with respect to FIGS. 10 and 11 in which like reference numbers are used where appropriate for like components as used in FIG. 8. Thus, the replacement column 800 is shown and the replacement row 801 is shown. A Y-select transistor 870 is included which is turned on in order to enable sensing of the replacement row as an identifier of a column to be replaced. Also, the output of the sense amplifier circuitry 820 on line 821 is supplied to a "flip" circuit 871. The output of the flip circuit 871 is supplied on line 872 to provide the value of the data stored in the replacement column 800. The normal sense amp 820 also supplies its output on line 873, as signal REDS to a sense amp redundancy control logic 874. The sense amp redundancy control logic 874 is responsive to the output of the extra sense amplifier 831 and the signal REDS on line 873 to generate a control signal DAF on line 875 which controls the flip circuit 871 in order to ensure that the proper data is supplied on line 872 as indicated by the contents of the replacement column 800. Similarly, a mode select circuit, such as a content addressable memory which indicates the column mode replacement 876 is coupled to the control logic 874 to enable column replacement.

The timing for the column replacement is shown in FIG. 11. An address for column replacement mode becomes valid at time 880 as indicated in FIG. 11. The buried diffusion word lines, as indicated at trace 881, are charged to the supply potential. The row decoding causes the word line in the array to be driven to a read potential at time 882 for in this example word line WL0. Word line WL1 remains the ground potential as indicated at trace 883. Bit line GL0 is driven to the ground potential at time 884 to select the column between bit line GL0 and bit line BL0 in the array. In order to enable the replacement column, the select transistor 870 is driven with the control signal YRP at ground potential at time 885. Also, the replacement word line RWL0 is driven to a read potential at time 886. Replacement row RWL1 is left at the ground potential as indicated at trace 887, when the row coupled to redundant RWL0 is used to select a replacement column. With the replacement word line RWL0 and the bit line BL0 charged to the read potential in the redundant array, sense amp 820 generates the output REDS at time 890 in response to data 891 on bit line BL0. The redundant sense amp 831 and the sense amp control circuit 874 generate the signal DAF at time 892 in response to the data 893 indicated by redundant bit line RBL0. Redundant bit line RBL1 remains at the ground potential as indicated by line 894.

At time 895, the control signal YRP and the replacement word line RWL0 are driven to opposite states. This connects the main array to the sense amp circuitry 820, and turns off the extra row circuitry 801. Bit line BL0 at time 896 therefore reflects the actual data stored in the array at the row indicated by word line WL0 in the defective column. However, the DAF signal at time 892 indicates the actual data to be output. Sense amp 820 supplies the signal on line 821 which may supply the wrong data because of the failed column during time interval 897. However, the DAF signal causes the flip circuit 871 to cause the data during interval 898 to indicate the correct data.

Thus, the replacement column is programmed with data to cause a cell in the array which stores 0 but should store 1 to be inverted by the flip circuit 871, or data in the array which stores 1 which should store a 0 to be inverted by the flip circuit 871. If the data in the array is correct, then it may not be inverted by the flip circuit 871 and the replacement column stores a value indicating that the actual array data is correct for this row. Thus for example, if four data bits in a particular column read 1111, but the correct data is 1010, then the redundant column will store 0101. This will cause that the flip circuit to invert the data stored in the second and fourth rows to the correct values. Alternatively, if the data in the array reads 0000, but the correct data is 1010, then the data in the redundant column is also 1010. This causes the first and third bits in the array to be inverted from 1 to 0.

Accordingly, the present invention allows the use of the extra column and the extra row in place of additional address registers for storing the address for failed rows and failed columns, such as used in the prior art. However, the unique redundancy cells of the present invention are also suitable using more traditional failure addressing techniques.

Accordingly, a redundancy architecture has been provided which is based on a two transistor redundancy cell that has a layout of about half of the layout of typical prior art. Both row and column failure can be fixed using the redundancy architecture of the present invention. Also, the redundant array can be utilized not only for code replacement but also for implementing the failure address register.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory comprising:
   an array of read only memory cells;
   a set of bit lines coupled with array;
   a plurality of sense amplifiers, coupled to the set of bit lines, which sense data values stored in the array in selected columns in response to addresses;
   a set of word lines coupled with the array;
   a plurality of word line drivers coupled to the set of word lines, which drive a read potential to rows of memory cells in the array in response to addresses;
   a column of electrically programmable memory cells coupled to the set of word lines, including an extra bit line coupled to the column of electrically programmable memory cells and an extra sense amplifier coupled to the extra bit line;
   a row of electrically programmable memory cells coupled to the set of bit lines, including an extra word line coupled to the row of electrically programmable memory cells, and an extra word line driver coupled to the extra word line; and
   logic coupled to the extra sense amplifier and the extra word line driver which is responsive to data stored in an electrically programmable memory cell in the extra column and coupled to a particular word line in the set of word lines indicated by output of the extra sense amplifier to enable the plurality of sense amplifiers to output data from the extra row as a replacement for the particular row in the array.

2. The integrated circuit memory of claim 1, wherein the electrically programmable memory cells in the extra row comprise:
   a diffusion word line spaced away from the extra word line;
   first and second diffusion regions between the diffusion word line and the extra word line, and a channel region between the first diffusion region and the second diffusion region;
   a third diffusion region adjacent the extra word line opposite the second diffusion region, arranged so that the second diffusion acts a source terminal, the third diffusion acts as a drain terminal, and the extra word line acts as a gate of a transistor;
   a floating gate member arranged to overly a segment of the diffusion word line, and to extend between the diffusion word line and the extra word line around the first diffusion region and over the channel region between the first diffusion region and the second diffusion region; and
   a first contact between the first diffusion region and a first bit line in the set of bit lines, and a second contact between the third diffusion region and a second bit line in the set of bit lines.

3. The integrated circuit memory of claim 2, wherein the first bit line in the set of bit lines comprises a ground line.

4. The integrated circuit memory of claim 1, wherein the array of read only memory cells comprise mask programmed read only memory cells.

5. An integrated circuit memory comprising:
   an array of read only memory cells;
   a set of bit lines coupled with array;
   a plurality of sense amplifiers, coupled to the set of bit lines, which sense data values stored in the array in selected columns in response to addresses;
   a set of word lines coupled with the array;
   a plurality of word line drivers coupled to the set of word lines, which drive a read potential to rows of memory cells in the array in response to addresses;
   a column of electrically programmable memory cells adjacent the array and coupled to the set of word lines, including an extra bit line coupled to the column of electrically programmable memory cells and an extra sense amplifier coupled to the extra bit line;
   a row of electrically programmable memory cells adjacent to the array and coupled to the set of bit lines, including an extra word line coupled to the row of electrically programmable memory cells, and an extra word line driver coupled to the extra word line; and
   logic coupled to the extra sense amplifier and the extra word line driver which is responsive to data stored in an electrically programmable memory cell in the extra row and coupled to a particular bit line in the set of bit lines indicated by output of a sense amplifier in the plurality of sense amplifiers, and to output of the extra sense amplifier to output data from the extra column as a replacement for the particular column in the array.

6. The integrated circuit memory of claim 5, including extensions of word lines in the set of word lines which couple the electrically programmable memory cells in the extra column to the set of word lines in the array, and wherein the electrically programmable memory cells in the extra column comprise:

- a diffusion word line spaced away from a particular extension of a particular word line in the set of word lines; first and second diffusion regions between the diffusion word line and the particular extension, and a channel region between the first diffusion region and the second diffusion region;
- a third diffusion region adjacent the particular extension opposite the second diffusion region, arranged so that the second diffusion acts a source terminal, the third diffusion acts as a drain terminal, and the particular extension acts as a gate of a transistor;
- a floating gate member arranged to overly a segment of the diffusion word line, and to extend between the diffusion word line and the particular extension around the first diffusion region and over the channel region between the first diffusion region and the second diffusion region; and
- a first contact between the first diffusion region and the first redundant bit line, and a second contact between the third diffusion region and the second redundant bit line.

7. The integrated circuit memory of claim 6, wherein the first redundant bit line comprises a ground line.

8. The integrated circuit memory of claim 5, wherein the array of read only memory cells comprise mask programmed read only memory cells.

9. An integrated circuit memory comprising:

an array of read only memory cells;
a set of bit lines coupled with array;
a plurality of sense amplifiers, coupled to the set of bit lines, which sense data values stored in the array in selected columns in response to addresses;
a set of word lines coupled with the array;
a plurality of word line drivers coupled to the set of word lines, which drive a read potential to rows of memory cells in the array in response to addresses;
a column of electrically programmable memory cells adjacent the array and coupled to the set of word lines, including an extra bit line coupled to the column of electrically programmable memory cells and an extra sense amplifier coupled to the extra bit line;
a row of electrically programmable memory cells adjacent to the array and coupled to the set of bit lines, including an extra word line coupled to the row of electrically programmable memory cells, and an extra word line driver coupled to the extra word line; and
logic coupled to the extra sense amplifier and the extra word line driver having
  a first mode which is responsive to data stored in an electrically programmable memory cell in the extra column and coupled to a particular word line in the set of word lines indicated by output of the extra sense amplifier to enable the plurality of sense amplifiers to output data from the extra row as a replacement for the particular row in the array,
  a second mode which is responsive to data stored in an electrically programmable memory cell in the extra row and coupled to a particular bit line in the set of bit lines indicated by output of a sense amplifier in the plurality of sense amplifiers, and to output of the extra sense amplifier to output data from the extra column as a replacement for the particular column in the array, and
  a mode select circuit by which one of the first and second modes is selected.

10. The integrated circuit memory of claim 9, wherein the electrically programmable memory cells in the extra row comprise:

- a diffusion word line spaced away from the extra word line;
- first and second diffusion regions between the diffusion word line and the extra word line, and a channel region between the first diffusion region and the second diffusion region;
- a third diffusion region adjacent the extra word line opposite the second diffusion region, arranged so that the second diffusion acts a source terminal, the third diffusion acts as a drain terminal, and the extra word line acts as a gate of a transistor;
- a floating gate member arranged to overly a segment of the diffusion word line, and to extend between the diffusion word line and the extra word line around the first diffusion region and over the channel region between the first diffusion region and the second diffusion region; and
- a first contact between the first diffusion region and a first bit line in the set of bit lines, and a second contact between the third diffusion region and a second bit line in the set of bit lines.

11. The integrated circuit memory of claim 10, wherein the first bit line in the set of bit lines comprises a ground line.

12. The integrated circuit memory of claim 9, wherein the array of read only memory cells comprise mask programmed read only memory cells.

13. The integrated circuit memory of claim 9, including extensions of word lines in the set of word lines which couple the electrically programmable memory cells in the extra column to the set of word lines in the array, and wherein the electrically programmable memory cells in the extra column comprise:

- a diffusion word line spaced away from a particular extension of a particular word line in the set of word lines;
- first and second diffusion regions between the diffusion word line and the particular extension, and a channel region between the first diffusion region and the second diffusion region;
- a third diffusion region adjacent the particular extension opposite the second diffusion region, arranged so that the second diffusion acts a source terminal, the third diffusion acts as a drain terminal, and the particular extension acts as a gate of a transistor;
- a floating gate member arranged to overly a segment of the diffusion word line, and to extend between the diffusion word line and the particular extension around the first diffusion region and over the channel region between the first diffusion region and the second diffusion region; and
- a first contact between the first diffusion region and the first redundant bit line, and a second contact between the third diffusion region and the second redundant bit line.

14. The integrated circuit memory of claim 13, wherein the first redundant bit line comprises a ground line.

* * * * *